United States Patent [19]

Aoshima et al.

[11] Patent Number: 4,980,632

[45] Date of Patent: Dec. 25, 1990

[54] ELECTRICAL SIGNAL OBSERVING DEVICE

[75] Inventors: Shinichiro Aoshima; Tsuneyuki Urakami; Yutaka Tsuchiya, all of Shizuoka, Japan

[73] Assignee: Hamamatsu Photonics Kabushiki Kaisha, Shizuoka, Japan

[21] Appl. No.: 358,220

[22] Filed: May 30, 1989

[30] Foreign Application Priority Data

May 30, 1988 [JP] Japan .................. 63-132051

[51] Int. Cl.⁵ .................. G01R 31/00; G01R 29/21
[52] U.S. Cl. .................. 324/96; 324/77 K; 324/121 R; 350/356
[58] Field of Search .................. 324/121 R, 96, 244, 324/77 K; 350/356, 377, 374; 455/601; 356/368; 250/227

[56] References Cited

U.S. PATENT DOCUMENTS

| | | | |
|---|---|---|---|
| 3,614,451 | 10/1971 | Gun | 324/96 |
| 3,860,880 | 1/1975 | Yariv et al. | 330/5 |
| 4,070,621 | 1/1978 | Bassen et al. | 324/96 |
| 4,401,900 | 8/1983 | Faris | 307/352 |
| 4,446,425 | 5/1984 | Valdmanis et al. | 324/77 K |
| 4,465,969 | 8/1984 | Tada et al. | 324/96 |
| 4,631,423 | 12/1986 | Faris | 307/352 |
| 4,663,596 | 5/1987 | Heeks | 455/601 |
| 4,755,745 | 7/1988 | Cohen | 324/77 K |
| 4,864,220 | 9/1989 | Aoshima et al. | 324/96 |

FOREIGN PATENT DOCUMENTS 0197196  10/1986  European Pat. Off. .
0299465  1/1989   European Pat. Off. .

Primary Examiner—Reinhard J. Eisenzopf
Assistant Examiner—Vinh P Nguyen
Attorney, Agent, or Firm—Finnegan, Henderson, Farabow, Garrett and Dunner

[57] ABSTRACT

The electrical signal observing device measures the electrical signal by applying the electrical signal to be measured to an optical amplifier in order to modulate a short pulse light train directed through the electrical amplifier. The electrical signal to be measured acts as a gain control for the optical amplifier. The photodetector detects the output of the optical amplifier and applies a resultant electrical signal to an integrator circuit after which the signal is displayed. The signal may be displayed in a time base fashion using a sweep generated by a delay system of the short pulse light train.

12 Claims, 7 Drawing Sheets

ELECTRICAL SIGNAL OBSERVING DEVICE

BACKGROUND OF THE INVENTION

This invention relates to electrical signal observing devices in which an electrical signal to be measured is sampled with an optical signal to obtain an observation signal, and more particularly to an electrical signal observing device which has a simple construction and a high efficiency.

Generally, repetitive high-speed electrical signals are measured with a sampling type oscilloscope (whose resolution is 20 to 30 pico-seconds at best) and single phenomena are measured with a real time oscilloscope (whose resolution is about 300 pico-seconds at best). However, the signals to be measured have increased in speed, and, consequently there is a demand for measurement of electrical signals with higher resolution.

One way to obtain higher resolution is illustrated by the voltage measuring device of U.S. Pat. No. 4,446,425. In this device, an optical modulator comprising a non-linear optical medium (Pockels cell), polarizer, analyzer and compensator is used to sample an electrical signal with a short pulse light beam. However, using the technique of sampling an electrical signal with a short pulse light beam is not applicable to the measurement of single event phenomena.

On the other hand, European Patent Application (OPI) No. 197196 (the term "OPI" as used herein means an "unexamined published application") discloses an electrically-electron optical oscilloscope in which, instead of a short pulse light beam, a continuous wave light beam (CW light beam) is employed.

The above-described conventional device employs an optical modulator including a non-linear optical medium such as a Pockels cell which is generally expensive, and difficult to handle. Furthermore, this conventional device needs a polarizer, an analyzer and a compensator in addition to the non-linear optical medium, and therefore its optical system is unavoidably complicated and its adjustment is intricate and troublesome. The optical modulator using the non-linear optical medium merely changes light transmittance using the change in light polarization, and does not have amplification capabilities. Therefore this device cannot effectively utilize the incident light and has a low S/N ratio.

SUMMARY OF THE INVENTION

An object of this invention is to overcome the disadvantage of conventional electrical signal observing devices.

Another object of the invention is an electrical signal observing device capable of using effectively an incident light beam.

These and other objects are achieved by an electrical signal observing device in which an electrical signal to be measured is sampled with an optical signal to obtain an observation signal which, according to the invention, comprises means for generating a short pulse light train having a series of pulses each of which has a duration less than the duration of the electrical signal to be measured, optical amplifying means for amplifying the pulse light train, the optical amplifying means having a gain controlled by the electrical signal to be measured, a photodetector for detecting amplified optical pulses from the optical amplifying means and generating an observation signal, a delay system for generating a variable delay between the electrical signal to be measured and the short pulse light train; and a display unit for displaying an output of the observation photodetector as a function of the amount of delay.

In one aspect of the electrical signal observing device of the invention, the electrical signal to be measured is branched and timed, and the short pulse light train is produced by a laser device.

In another aspect of the invention, the delay system is a phase shift circuit for shifting the phase of the electrical signal to be measured for the case where the electrical signal to be measured has been branched for generation of the short pulse light train.

In a further aspect of the invention, the optical amplifier is a non-resonance traveling-wave type optical amplifier having a semiconductor laser which has reflection at both end faces suppressed.

In yet another aspect of the invention, where a photodetector is under measurement, an optical signal obtained by splitting the short pulse light train is converted into an electrical signal with the photodetector to be measured, and the electrical signal thus obtained is used to control the gain of the optical amplifier, for measurement of the properties of the photodetector.

In another aspect, the invention further comprises a chopping element for turning on and off with a predetermined frequency the optical signal obtained by splitting the short pulse light train or the electrical signal to be measured, and a lock-in amplifier having a narrow band width for detecting only the predetermined frequency component of the output from the photodetector.

In a further aspect of the invention, the optical amplifier also operates as the light chopping element.

In the device of the invention, a plurality of optical amplifiers are juxtaposed and an image sensor for detecting the output optical signal of the optical amplifiers is provided, so that a plurality of electrical signals are observed in a parallel mode.

The accompanying drawings, which are incorporated in and constitute a part of this specification, illustrate one embodiment of the invention and, together with the description, serve to explain the principles of the invention.

DESCRIPTION OF THE PREFERRED EMBODIMENTS OF THE INVENTION

Reference will now be made in detail to the present preferred embodiments of the invention, an example of which is illustrated in the accompanying drawings.

Figure 1:
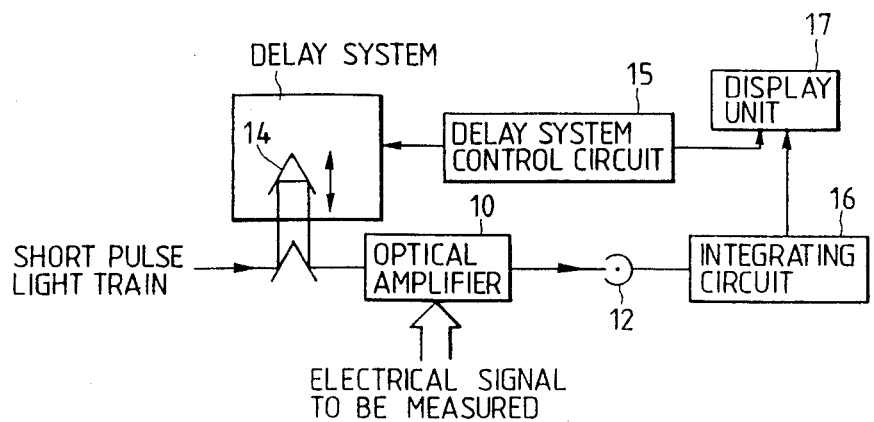
FIG. 1 is a block diagram showing a basic arrangement of an electrical signal observing device according to the present invention.

In this invention, to obtain an observation signal by sampling an electrical signal to be measured with an optical signal, as shown in FIG. 1, a short pulse light train shorter in pulse width than the electrical signal to be measured is amplified and modulated with an optical amplifier 10 the gain of which is controlled by the electrical signal to be measured. The output light from the optical amplifier 10 is detected by the photodetector 12 to obtain an observation signal. A delay system 14 (an optical delay system for delaying a short pulse light train in the case of FIG. 1) changes the amount of delay between the electrical signal and the short pulse light train with the aid of a delay system control circuit 15, whereby the electrical signal is sampled with the short pulse light train to obtain the observation signal.

Figure 2A:
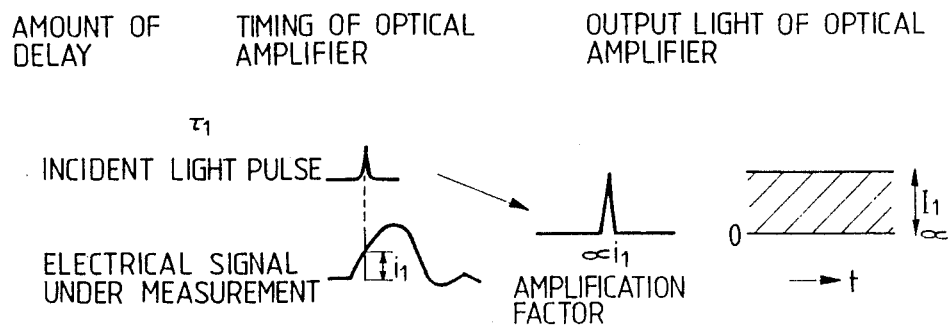
FIGS. 2A–2D illustrate characteristics of the basic operation of the electrical signal observing device according to the present invention.
Figure 2B:
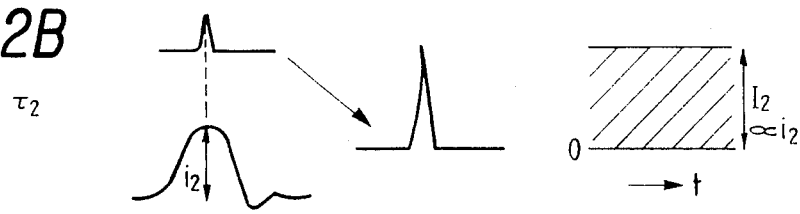
Figure 2C:
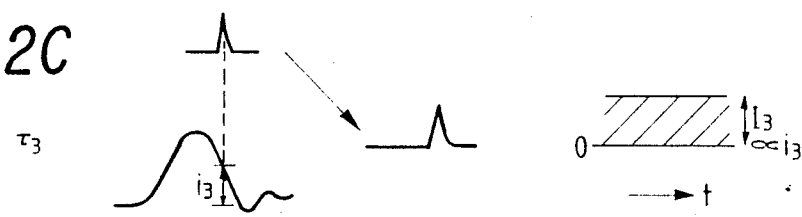
Figure 2D:
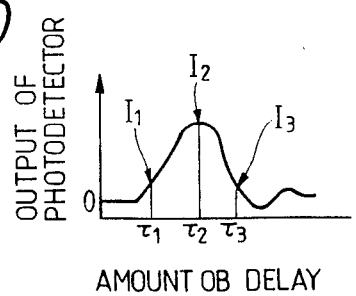

When, as shown in FIGS. 2A-C the amount of delay between the short pulse light train and the electrical signal to be measured is $\tau_1$, $\tau_2$ and $\tau_3$, respectively, at certain time instants being continuously changed by the delay system control circuit 15, the output short pulse light beam of optical amplifier 10 is changed in intensity according to the timing of the electrical signal as shown in FIG. 2. Therefore, the outputs, $I_1$, $I_2$ and $I_3$ of the photodetector 12 provided through an integrating circuit 16 are observed, as a function of the amount of delay $\tau$, as shown in FIG. 2D. The result of the sampling of the electrical signal with the short pulse light train is displayed on a display unit 17. Optical amplifier 10 is an amplifying element, and therefore the sampling short pulse light train can be amplified in use.

Thus, the electrical signal observing device of the invention needs no polarizer or analyzer, and is consequently simple in construction. The invention can be manufactured at low cost, and its optical system can be adjusted with ease. Furthermore, since the invention modifies the amplification factor of the optical signal, instead of modifying the transmittance, the incident light beam can be effectively utilized. That is, the device operates efficiently and with a high S/N ratio.

The short pulse light train can be produced as follows: the electrical signal to be measured is branched, and a laser device is operated in synchronization with the electrical signal thus branched, to provide the short pulse light train. Using this technique, the electrical signal to be measured and the short pulse light train can be readily made synchronous with each other.

In order to produce a short pulse light beam of the order of 10 psec (picoseconds), a semiconductor laser device may be used.

In producing the short pulse light train using a branched electrical signal, a shift circuit for shifting the phase of the electrical signal thus branched may be used as the above-described delay system. Use of a shift circuit will make the delay system easy to construct.

The optical amplifier 10 that is capable of producing an optical output by amplifying input light by a factor that is dependent on an external electrical signal is available in various types including: a non-resonant traviling-wave type optical amplifier (TWA) which has an anti-reflection film coated on both end faces of a semiconductor laser to suppress reflection from those faces; a Fabry-Perot type optical amplifier (FPA) which uses a conventional semiconductor laser as an optical amplifier with it being biased below the threshold level for oscillation; an optical fiber Raman amplifier which utilizes Raman scattering induced in an optical fiber; an amplifier using a DFB laser; and an injection synchronous amplifier. Semiconductor amplifiers are advantageous because of their compactness and ease of control in operation.

Among semiconductor optical amplifiers, TWA and FPA are particularly advantageous. TWA has fast response to electrical signals and is capable of amplification of high speed optical signals. Because of the absence of resonator-dependent selectivity for wavelength, TWA has a broad (ca. 50 nm) wavelength range for gain and assures consistency in gain in the face of variation in the temprature of the amplifier or in the wavelength of incident light. TWA is also superior in terms of gain saturation and noise characteristic which are two important characteristics of an optical amplifier. On the other hand, FPA is easy to fabricate and allows a high gain to be attained in the neighborhood of a threshold value even with low current injection because it utilizes multiple reflections between both end faces to produce signal gain.

Another advantage of the semiconductor optical amplifiers is that their gain can be easily adjusted by changing the amount of injection current, so they can also be used as an optical switch by turning on or off the injection of current as in the present invention.

Figure 3:
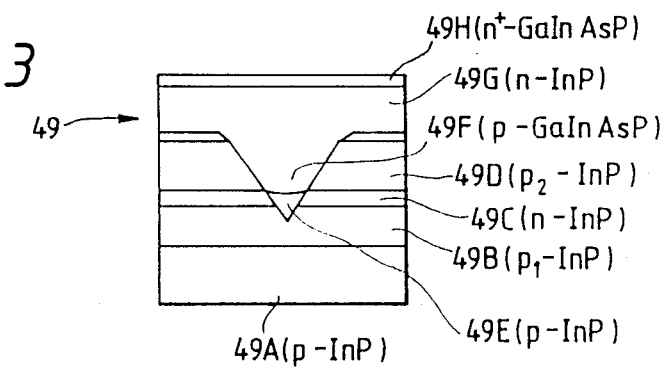
FIG. 3 is a sectional diagram showing one example of the structure of a semiconductor laser forming a traveling-wave type optical amplifier (TWA) which can be used as an optical amplifier in the present invention.

A TWA that is suitable for use in the present amplifiers has an anti-reflection film coated on both end faces of a semiconductor laser 49 of the VIPS (V-grooved inner stripe of P-substrate) structure shown in FIG. 3 which may be formed by the following steps: in the first cycle of liquid-phase growth, a pl-InP buffer layer 49B, n-InP block layer 49C and P$_2$-InP block layer 49D are grown on a p-InP substrate 49A; thereafter a V-shaped groove having a (111)B face is formed in 49B, 49C and 49D by wet etching, with a SiO$_2$ stripe mask being prepared by a conventional photolithographic process; and in the second cycle of liquid-phase growth, a P InP cladding layer 49E, P type or undoped GaInAsP active layer 49F, n-InP cladding layer 49G and N$^+$-GaInAsP contact layer 49H are grown successively. The GaInAsP active layer 49F is formed at the bottom of the V-shaped groove, with its width and thickness being controlled to ca. 1.2 $\mu$m and 0.10 $\mu$m respectively. Thereafter, electrodes are formed and end faces are created by cleavage. An anti-reflection film is then deposited onto both end faces of the resulting semiconductor laser 49 using a material such as SiO$_2$ so as to fabricate a TWA. The semiconductor lasser 49 of the VIPS structure has a sufficiently high efficiency of injection into the active layer to produce superior high output characteristics, so the TWA using this semiconductor laser also has high gain and high saturation energy.

Figure 4:
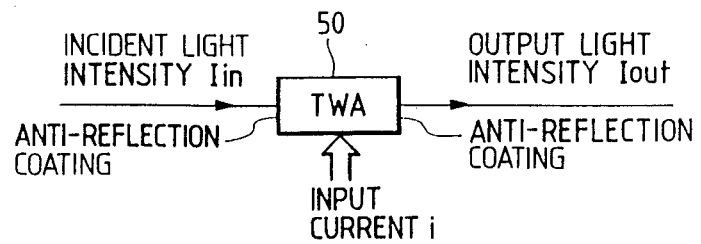
FIG. 4 is a block diagram for the description of the operating configuration of the TWA.
Figure 5:
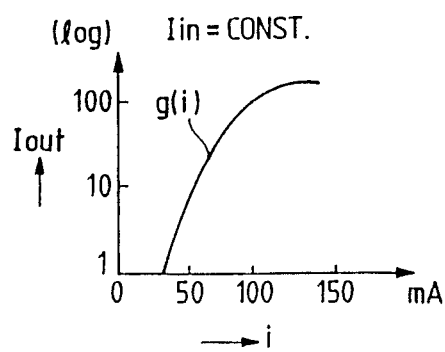
FIGS. 5 and 6 are graphs of output optical intensity characteristics of the TWA of the present invention.

The TWA 50 thus fabricated has a basic composition as shown in FIG. 4. When the intensity of input light $I_{in}$ being launched into the TWA 50 is constant, the intensity of output light $I_{out}$ from the TWA 50 will change non-linearly as shown in FIG. 5 in response to the change in input current i. Accordingly, if the value of incident light Intensity $I_{in}$ is constant, output light intensity $I_{out}$ can be controlled by input current i.

Figure 6:
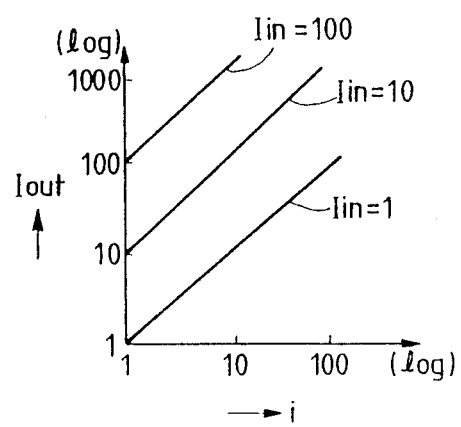

If, for simplification in description, it is assumed that only the linear part of characteristic curve g(i) is used (non-linear portion may be compensated), then a graphical representation as shown in FIG. 6 can be obtained from that of FIG. 5. Accordingly, the TWA can be used as a linear amplifier in the range illustrated in FIG. 6.

Figure 7:
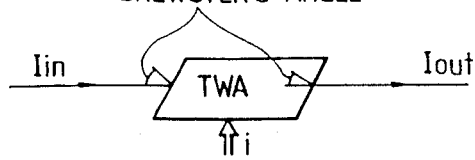
FIGS. 7, 8, 9, 10, and 11 are diagrams showing various modifications of the TWA according to the present invention.

In the TWA 50, reflection from both end faces is suppressed by the anti-reflection film coated thereon. It should, however, be noted that the anti-reflection film is not the sole mechanism for suppressing reflection from both end faces of the semiconductor laser and the same results can be attained by cutting each of the end faces at an angle equal to the Brewster's angle as shown in FIG. 7. In this case, the plane of polarizatio is restricted. However, this restriction may be an advantage in that any polarizer or analyzer is unnecessary when a need arises for restricting the plane of polarization.

Figure 8:
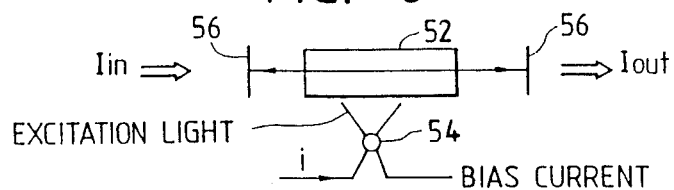
Figure 9:
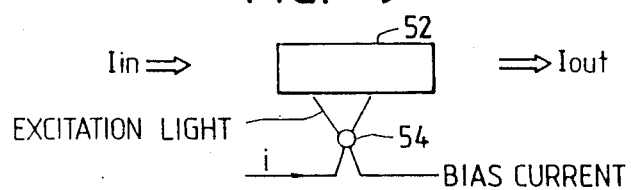

Besides the TWA 50 and FPA described above, other types of optical amplifiers can be used in the present invention, including the resonant optical amplifier shown in FIG. 8 which is biased to a level just below the threshold for oscillation by imparting excitation light to a solid laser medium 52 with a laser diode 54, and the non-resonant optical amplifier shonwn in FIG. 9 that is similar to TWA in which reflection from both end faces of the solid laser medium 52 is suppressed by providing an anti-reflection film or adjusting the angle of each end face to be equal to the Brewster's angle. In FIG. 8, the numeral 56 designates a resonant mirror. The laser diode 54 may or may not be supplied with a bias current for attaining a value in the neighborhood of the threshold level.

Figure 10:
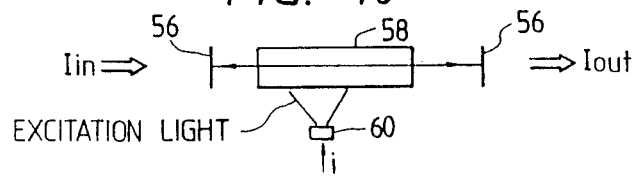

Another type of optical amplifier 10 that can be used in the present invention is shown in FIG. 10, in which a dye or gas laser medium 58 is excited with light from a light-emitting diode, a laser diode, various types of current control led lamps 60 or the like. Resonant mirrors 56 may be omitted from the system shonw FIG. 10.

Another example of optical amplifier 10 is as shown in FIG. 10. In the optical amplifier of FIG. 10, a light emitting diode or a current controlled lamp 60 applies an exciting light beam to a dye laser medium or gas laser medium 58. An optical amplifier according to this embodiment of the invention may have separate resonance mirrors 56 or mirrors 56 can be eliminated.

Figure 11:
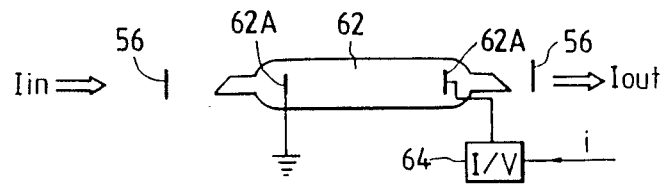

Another example of an optical amplifier 10 is shown in FIG. 11. In the optical amplifier of FIG. 11, a gas laser medium 62 is excited when a voltage is applied across electrodes 62A through a current-to-voltage converter 64. That is, electrical discharge is utilized to excite the laser medium. In this case also, the optical amplifier shown in FIG. 11 may be used without resonance mirrors 56.

Optical fibers may be used in the input and/or output optics of optical amplifier 10, and/or in at least one part of the incident optical system of photodetector 12. When the optical fibers are used, severe adjustment of the optical system is unnecessary, and there is greater freedom in arrangement of the components. These advantages of optical fibers permit the device to be miniaturized.

In the case where the delay system is an optical delay system capable of changing the optical path length between the short pulse light train and the optical amplifier, the electrical circuitry can be simplified.

Photodetector 12 may be made up of a photomultiplier, multi-channel plate built-in type photomultiplier, or a semiconductor photodetector such as a PIN photodiode.

Figure 12:
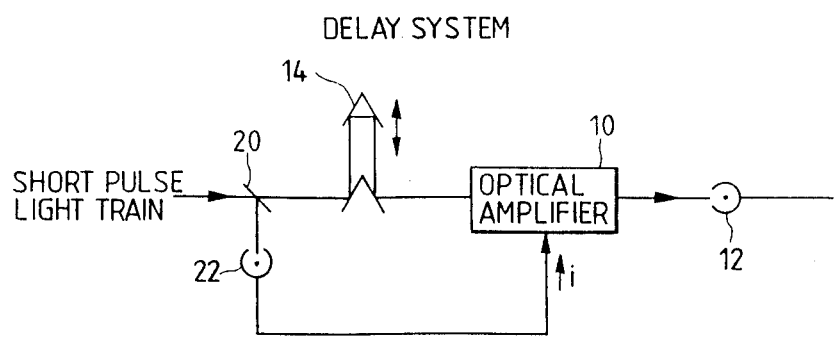
FIGS. 12 and 13 are each block diagrams showing other basic fundamental arrangements of the electrical signal observing device according to the present invention.

In the case where an object to be measured is a photodetector by measuring the output electrical signal of the measured photodetector, the device may be designed as shown in FIG. 12. The optical signal branched from the short pulse light train is split, with an optical branching unit 20, and is then converted into an electrical signal with a photodetector 22 under measurement, and the electrical signal from photodetector 22 is utilized to control the gain of optical amplifier 10. Short pulse light train generating laser device (not shown) may be a CPM ring dye laser which generates, for instance, a short pulse light beam having a pulse width on the order of 100 femto-seconds. In this case, the properties of the photodetector to be measured can be readily measured.

Figure 13:
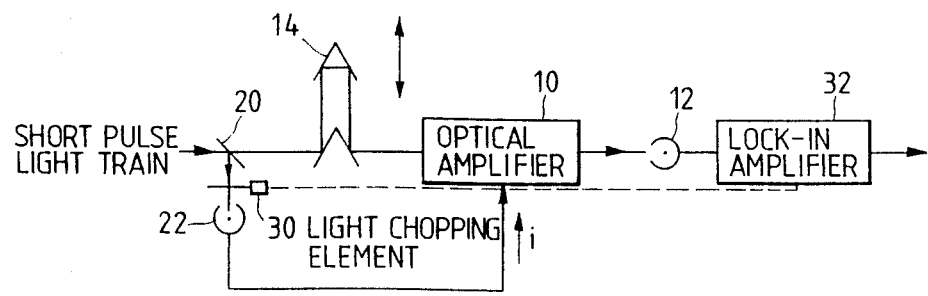

The electrical signal observing device shown in FIG. 13 comprises a light chopping element 30 for turning on and off the above-described branched optical signal with a predetermined frequency, and a lock-in amplifier 32 having a narrow band width to detect only the predetermined frequency component from the output signal of emergent photodetector 12. In this embodiment, the invention will have, in addition to the other advantages, an improved S/N ratio. Further, in place of an optical signal or an electrical signal to be measured, an electrical signal may be chopped by an electrical signal chopping element.

Light chopping element 30 may be a conventional light chopper such as an optical amplifier as described, an optical modulator utilizing an electro-optical effect (E-0 modulator), an A-0 modulator, an optical Kerr shutter, or a liquid crystal shutter. The light chopping element 30 may be placed between the optical branching unit 20 and the optical amplifier 10, or between the optical amplifier 10 and the photodetector 12. Furthermore, the optical amplifier 10 itself can also serve as a light chopping element 30.

When optical amplifier 10 is designed to also operate as light chopping element 30, it is unnecessary to provide an additional light chopping element, and, therefore, the invention is simple in construction.

Furthermore, when a plurality of optical amplifiers 10 are juxtaposed, and the output optical signals of the optical amplifiers 10 are detected with an image sensor, a plurality of electrical signals can be measured simultaneously in a parallel mode.

Figure 14:
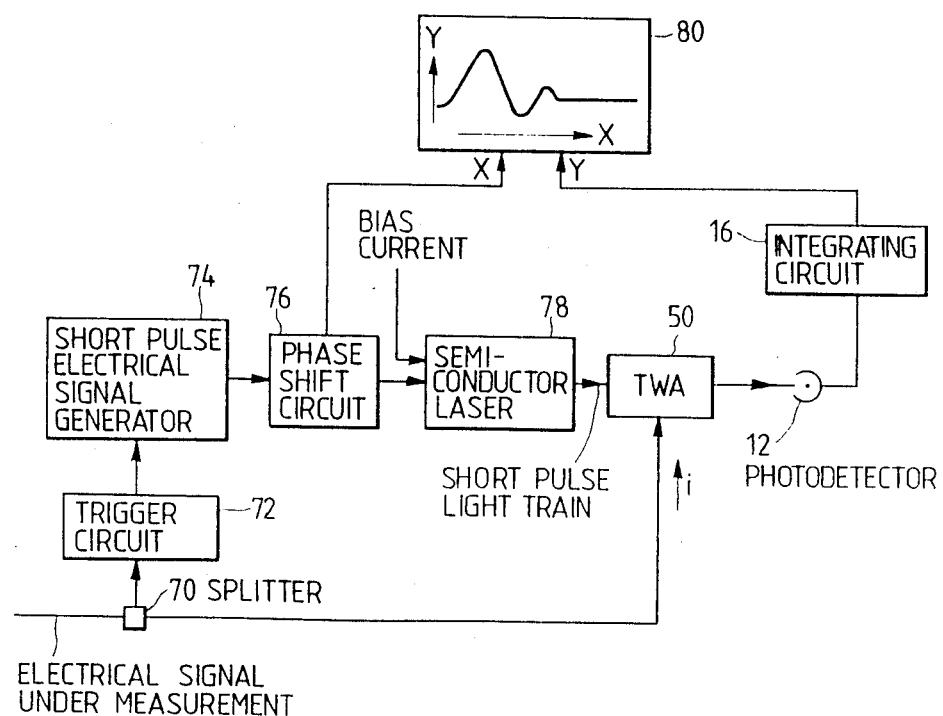
FIG. 14 is a block diagram showing the first preferred embodiment of the electrical signal observing device according to the present invention.

A first preferred embodiment of an electrical signal observing device of the invention as shown in FIG. 14, comprises: a splitter 70 for branching an electrical signal under measurement; a trigger circuit 72 for timing the electrical signal thus branched; a short pulse electrical signal generating circuit 74 for producing a short pulse electrical signal in response to the output of trigger circuit 72; a phase shift circuit 76 for shifting the phase of the short pulse outputted by short pulse electrical signal generating circuit 74; a semiconductor laser 78 for providing a short pulse light train in accordance with the output of phase shift circuit 76; a TWA (traveling-wave type optical amplifier) 50 which receives the short pulse light train from semiconductor laser 78 and the remaining of the electrical signal to be measured which has splitted by the splitter 70; a photodetector 12 for detecting the output light beam of TWA 50; and integrating circuit 16 for integrating the output of the photodetector 12; and a display unit, namely an X-Y recorder 80 to which the amount of delay is applied as an X-axis signal and the output of the photodetector 12 as a Y-axis signal.

Operation of the first preferred embodiment of the electrical signal observing device thus organized will be described.

The electrical signal under measurement is split into two parts by the splitter 70. With one of the two parts timed by the trigger circuit 72, a short pulse electrical signal synchronous with the electrical signal to be measured is formed by short pulse electrical signal generating circuit 74.

The short pulse electrical signal is applied through phase shift circuit 76 to semiconductor laser 78, where it is converted into a short pulse light train synchronous with the electrical signal to be measured.

In the embodiment, a DC bias current is applied to the semiconductor laser, because the application of a DC bias current can produce short pulse light beams. Depending on an object to be measured, the application of a DC bias current may be omitted.

The short pulse light train produced by semiconductor laser 78 is amplified by TWA 50 to which the other part of the electrical signal passed through splitter 70 is applied, and the output of TWA 50 is subjected to photoelectric conversion by photodetector 12.

The amount of delay between the electrical signal to be measured and the short pulse light train is changed by the phase shift circuit 76 connected between short pulse electrical signal generating circuit 74 and the semiconductor laser 78 (or between trigger circuit 72 and short pulse electrical signal generating circuit 74). The output of semiconductor laser 78, the short pulse light train, is amplified by TWA 50, detected by photodetector 12 and applied through the integrating circuit 16 to the X-Y recorder 80, where it is recorded as a function of the amount of delay.

If the amount of phase shift per unitary time is linear and known, then instead of X-Y recorder 80, an oscilloscope may be used.

In this embodiment, the amount of delay can be readily changed because of employment of the phase shift circuit 76.

Figure 15:
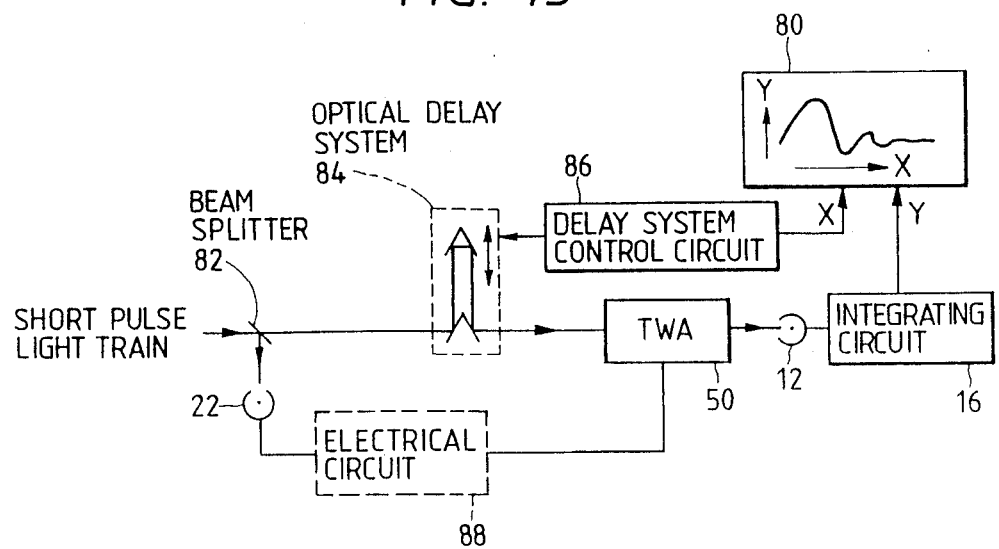
FIG. 15 is a block diagram showing a second preferred embodiment of the electrical signal observing device according to the present invention.

A second preferred embodiment of the invention is designed as follows: the electrical signal observing device shown in FIG. 13 which includes beam splitting device 20, delay system 14, optical amplifier 10, and photodetector 12, is modified as shown in FIG. 15 so that a beam splitter 82 is used as beam splitting device 20, TWA 50 is used as optical amplifier 10, and an optical delay system 84 is used as delay system 14. This embodiment further comprises a delay system control circuit 86 for controlling the amount of delay of optical delay system 84, and an X-Y recorder 80 which receives the amount of delay from the output of delay system control circuit 86 as an X-axis signal and the output of the photodetector 12 as a Y-axis signal through the integrating circuit 16.

In this second preferred embodiment the response time of a photodetector 22 [to be measured] can be measured.

In the second preferred embodiment, the output of photodetector 22 is employed as a gain control signal for the TWA 50. However, an electrical circuit 88 may be connected between the photodetector 22 and the TWA 50 to measure the rise time of the output of photodetector 22.

In the second preferred embodiment, optical delay system 84 is employed. However, an electrical delay circuit may be connected between photodetector 22 under measurement and TWA 50, to simplify the optical system.

Figure 16:
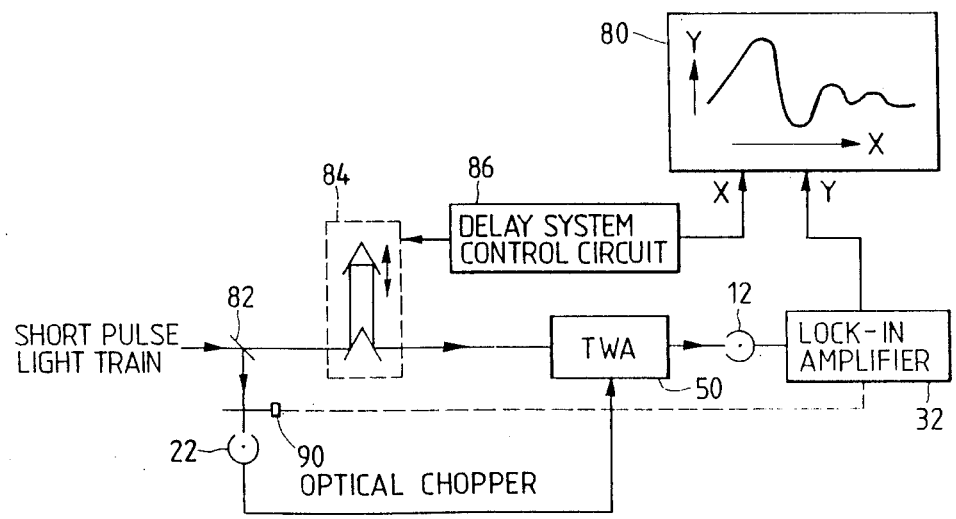
FIG. 16 is a block diagram showing a third preferred embodiment of the electrical signal observing device according to the present invention.

A third preferred embodiment of the invention will be described with reference to FIG. 16 in detail.

The third preferred embodiment of the invention is the same as the second preferred embodiment (FIG. 15) except that a lock-in amplifier 32 for locking in a frequency and an optical chopper 90 are added. Optical chopper 90 is used as light chopping element as shown in FIG. 13 (element 30).

The third preferred embodiment has, in addition to the advantages of the second embodiment an improvement of the S/N ratio.

The third preferred embodiment has lock-in detection as described above which is not present in the second embodiment. Lock-in detection can be applied to the first preferred embodiment (FIG. 14) by connecting the optical chopper between semiconductor laser 78 and TWA 50, or between TWA 50 and photodetector 12. Alternatively, an electrical chopper is provided between splitter 70 and TWA 50, or at any position in the path connecting splitter 70, trigger circuit 72, short pulse electrical signal generating circuit 74, phase shift circuit 76 and semiconductor laser 78, whereby the output of photodetector 12 is detected with the lock-in amplifier.

Figure 17:
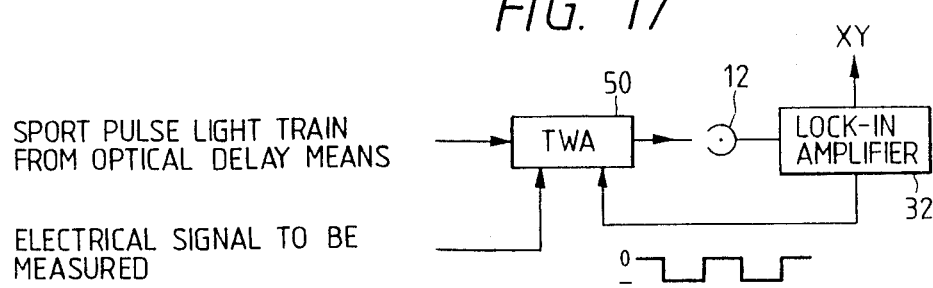
FIG. 17 is a block diagram showing a fourth of the electrical signal observing device according to the present invention.

A fourth embodiment of the invention will be described with reference to FIG. 17.

The fourth embodiment is designed as follows: in the electrical signal observing device shown in FIG. 16 (the third embodiment), TWA 50 is used also as a light chopping element instead of optical chopper 90.

In the fourth embodiment, it is unnecessary to provide an additional light chopping element. The electrical signal observing device is therefore simple in construction.

Figure 18:
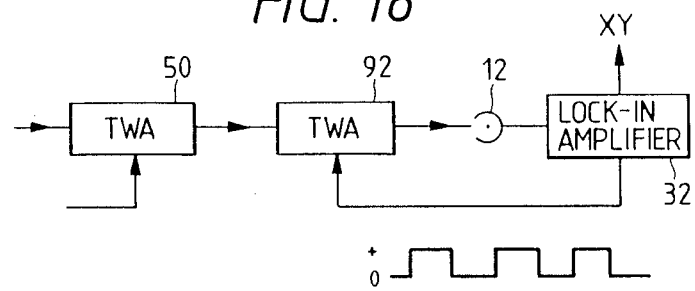
FIG. 18 is a block diagram showing a fifth preferred embodiment of the electrical signal observing device according to the present invention.

A fifth embodiment of the invention will be described with reference to FIG. 18 in detail.

The fifth embodiment is designed so that at least two optical amplifiers are connected in tandem. For example: in the electrical signal device as shown in FIG. 16 (the third embodiment), instead of the optical chopper 90, another TWA 92 is connected to the output of the TWA 50, that is, the TWAs 50 and 92 are connected in tandem. In this case, one of the TWAs 50 and 92 serves as an optical chopper.

In the fifth embodiment, the amplification factor is high, because TWAs 50 and 92 operating also as optical amplifiers are arranged in tandem as described above.

TWAs 50 and 92 may be joined into one unit, for instance, by joining the end faces thereof by adhesive bonding thereby to increase the mechanical strength and vibration resistance thereof.

Figure 19:
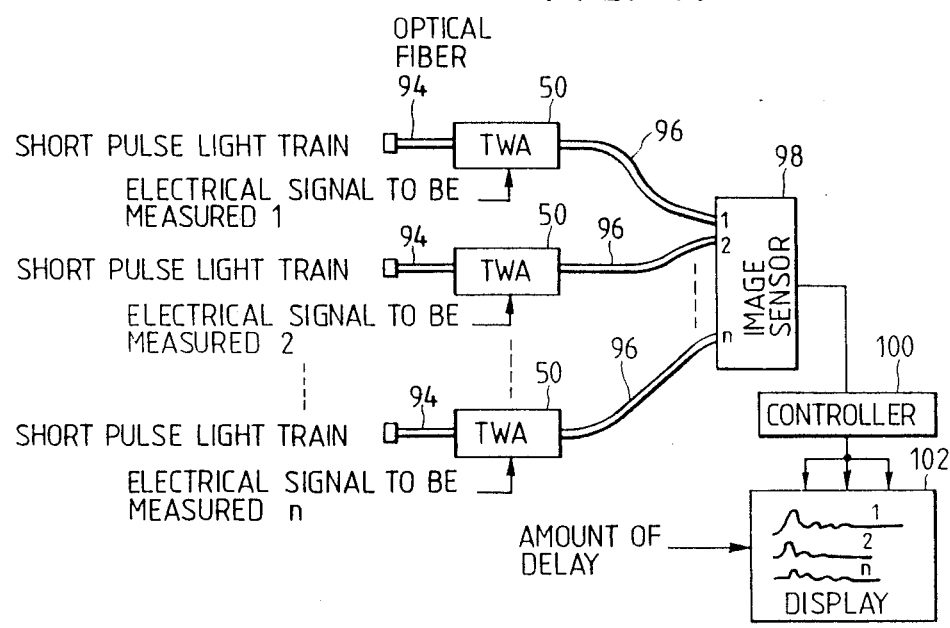
FIG. 19 is a block diagram showing a sixth preferred embodiment of the electrical signal observing device according to the present invention.

A sixth embodiment of the invention will be described with reference to FIG. 19 in detail.

In the sixth embodiment, a plurality of TWAs 50 operating as optical amplifiers are juxtaposed in such a manner that a short pulse light train is applied to TWAs 50 through respective optical fibers 94, and the optical outputs of the TWAs 50 are applied through respective optical fibers 96 to an image sensor 98. The output of image sensor 98 is applied through a controller 100 to a display unit 102, on the screen of which the corresponding image is displayed.

Image sensor 98 may be a linear image sensor such as a CCD image sensor.

With the sixth embodiment, a plurality of electrical signals can be measured in a parallel mode at the same time. The amounts of delay of TWA's 50 may be changed so that a single waveform can be observed in a parallel mode. Furthermore, a spectroscope may be used to divide a light beam into optical wavelength components, so that the components are detected by TWAs 50, respectively.

Having described several preferred embodiments of the invention, it is recognized that variations and modifications thereof falling within the spirit and scope of the invention, as defined by the appended claims, may be apparent to those skilled in the art.

What is claimed is:

1. An electrical signal observing device in which an electrical signal to be measured is sampled with an optical signal to obtain an observation signal, comprising:
   means for generating a short pulse light train having a series of optical pulses, each of said optical pulses having a duration less than the duration of the electrical signal to be measured;
   optical amplifying means for amplifying said optical pulses of said short pulse light train, said optical amplifying means having a gain controlled by the electrical signal under measurement;
   photodetecting means for generating an observation signal in response to amplified optical pulses from said optical amplifying means;
   delay means for generating a variable delay between said electrical signal under measurement and said short pulse light train; and
   a display unit for displaying an output of said photodetecting means as a function of the variable delay.

2. An electrical signal observing device as claimed in claim 1, wherein said short pulse light train is produced by a laser device in accordance with an electrical signal branched from said electrical signal to be measured.

3. An electrical signal observing device as claimed in claim 2, wherein said delay system includes a phase shift circuit for shifting the phase of said branched electrical signal.

4. An electrical signal observing device as claimed in claim 1, wherein said optical amplifying means comprises a non-resonance optical amplifier including a semiconductor laser.

5. An electrical signal observing device as claimed in claim 4, wherein said optical amplifier is a traveling wave type optical amplifier including a semiconductor laser, said semiconductor laser has reflections suppressed.

6. An electrical signal observing device as claimed in claim 1, wherein said photodetector is an object to be measured and said short pulse light train is split into a duplicate short pulse light train, said photodetector converting one of said duplicate short pulse train into the electrical signal to be measured, and wherein a gain of said optical amplifier is controlled with said electrical signal.

7. An electrical signal observing device as claimed in any of claims 1 to 6, further including a light chopping element for turning said pulse light train on and off with a predetermined frequency; and
   a lock-in amplifier having a narrow band width for detecting the predetermined frequency component from an output of said photodetecting means.

8. An electrical signal observing device as claimed in claim 7, wherein said optical amplifying means also serves as said a light chopping element.

9. An electrical signal observing device as claimed in claim 1, wherein said amplifying means includes a plurality of optical amplifiers for producing corresponding amplified optical signals, and wherein said observation photodetector includes an image sensor for detecting and observing the amplified optical signals of said optical amplifiers in a parallel mode at the same time.

10. An electrical signal observing device as claimed in claim 6, further including a light chopping element for turning on and off said one of said duplicate short pulse train with a predetermined frequency; and
    a lock-in amplifier having a narrow band width for detecting the predetermined frequency component from an output of said photodetecting means.

11. An electrical signal observing device as claimed in claim 7, wherein said optical amplifying means comprises at least two optical amplifiers connected in tandem and at least one of said optical amplifiers operating as a light chopping element.

12. An electrical signal observing device as claimed in any of claims 1 to 6, further including:
    an electrical signal chopping element for turning on and off said electrical signal to be measured with a predetermined frequency; and
    a lock-in amplifier having a narrow band width for detecting the predetermined frequency component from an output of said photodetecting means.

* * * * *